(12) United States Patent
Chen et al.

(10) Patent No.: US 10,872,873 B2
(45) Date of Patent: Dec. 22, 2020

(54) METHOD FOR BONDING WAFERS AND BONDING TOOL

(71) Applicant: TAIWAN SEMICONDUCTOR MANUFACTURING CO., LTD., Hsinchu (TW)

(72) Inventors: Chien-Chih Chen, Changhua County (TW); Tsung-Yi Yang, Tainan (TW); Chung-I Hung, Chuanhwai County (TW); Mu-Han Cheng, Tainan (TW); Tzu-Shin Chen, Tainan (TW); Su-Yu Yeh, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/870,569

(22) Filed: Jan. 12, 2018

(65) Prior Publication Data

US 2019/0148333 A1    May 16, 2019

Related U.S. Application Data

(60) Provisional application No. 62/585,969, filed on Nov. 14, 2017.

(51) Int. Cl.
*H01L 23/00*  (2006.01)
*H01L 21/66*  (2006.01)

(52) U.S. Cl.
CPC ............ *H01L 24/741* (2013.01); *H01L 22/12* (2013.01); *H01L 24/80* (2013.01); *H01L 24/94* (2013.01); *H01L 2224/7501* (2013.01); *H01L 2224/7555* (2013.01); *H01L 2224/7598* (2013.01); *H01L 2224/75252* (2013.01); *H01L 2224/75301* (2013.01); *H01L 2224/75701* (2013.01); *H01L 2224/75744* (2013.01); *H01L 2224/75753* (2013.01); *H01L 2224/75901* (2013.01); *H01L 2224/75983* (2013.01); *H01L 2224/75985* (2013.01); *H01L 2224/80011* (2013.01); *H01L 2224/8013* (2013.01); *H01L 2224/80024* (2013.01); *H01L 2224/80149* (2013.01);

(Continued)

(58) Field of Classification Search
CPC ....... H01L 24/741; H01L 24/80; H01L 24/94; H01L 2224/7501; H01L 2224/75753; H01L 2224/80011; H01L 2224/80908
See application file for complete search history.

(56) References Cited

U.S. PATENT DOCUMENTS 4,883,215 A  *  11/1989  Goesele ............ H01L 21/02052
                                                  438/455
5,849,607 A  *  12/1998  Seo .................. H01L 24/80
                                                  438/114

(Continued)

FOREIGN PATENT DOCUMENTS

JP            2015153954 A  *  8/2015

*Primary Examiner* — Charles D Garber
*Assistant Examiner* — S M Sohel Imtiaz
(74) *Attorney, Agent, or Firm* — Maschoff Brennan

(57) ABSTRACT

A method is provided and includes the following steps. A first wafer is coupled to a first support of a bonding tool and a second wafer is coupled to a second support of the bonding tool. The second wafer is bonded to the first wafer with the first wafer coupled to the first support. Whether a bubble is between the bonded first and second wafers in the bonding tool is detected.

20 Claims, 11 Drawing Sheets

(52) U.S. Cl.
CPC ............... *H01L 2224/80203* (2013.01); *H01L 2224/80908* (2013.01)

(56) References Cited

U.S. PATENT DOCUMENTS

| | | | | |
|---|---|---|---|---|
| 5,915,193 | A * | 6/1999 | Tong | H01L 21/02052 228/206 |
| 2003/0129508 | A1* | 7/2003 | Lin | G03F 7/7065 430/30 |
| 2008/0041819 | A1* | 2/2008 | Kim | H01J 37/32862 216/67 |
| 2009/0309623 | A1* | 12/2009 | Holland | G01R 31/2648 324/750.21 |
| 2012/0006463 | A1* | 1/2012 | Gaudin | H01L 25/50 156/64 |
| 2012/0041583 | A1* | 2/2012 | Conley | H01L 21/67259 700/110 |
| 2015/0069247 | A1* | 3/2015 | Asundi | G01N 21/23 250/341.3 |
| 2015/0247794 | A1* | 9/2015 | Olesberg | G01N 21/3577 250/339.07 |
| 2015/0357226 | A1* | 12/2015 | Liu | H01L 21/67092 438/457 |
| 2017/0053889 | A1* | 2/2017 | Kakutani | H01L 24/741 |
| 2017/0221856 | A1* | 8/2017 | Yamauchi | H01L 21/187 |
| 2018/0019225 | A1* | 1/2018 | Matsunaga | H01L 21/187 |
| 2018/0059032 | A1* | 3/2018 | Perrot | H01L 21/6836 |

* cited by examiner

US 10,872,873 B2

METHOD FOR BONDING WAFERS AND BONDING TOOL

RELATED APPLICATIONS

This application claims priority to US provisional application No. 62/585,969, filed on Nov. 14, 2017, which is herein incorporated by reference.

BACKGROUND

Manufacturing of an integrated circuit (IC) has been driven by increasing the density of the IC formed in a semiconductor device. This is accomplished by implementing more aggressive design rules to allow a larger density of the IC device to be formed. Nonetheless, the increased density of IC devices, such as transistors, has also increased the complexity of processing semiconductor devices with decreased feature sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
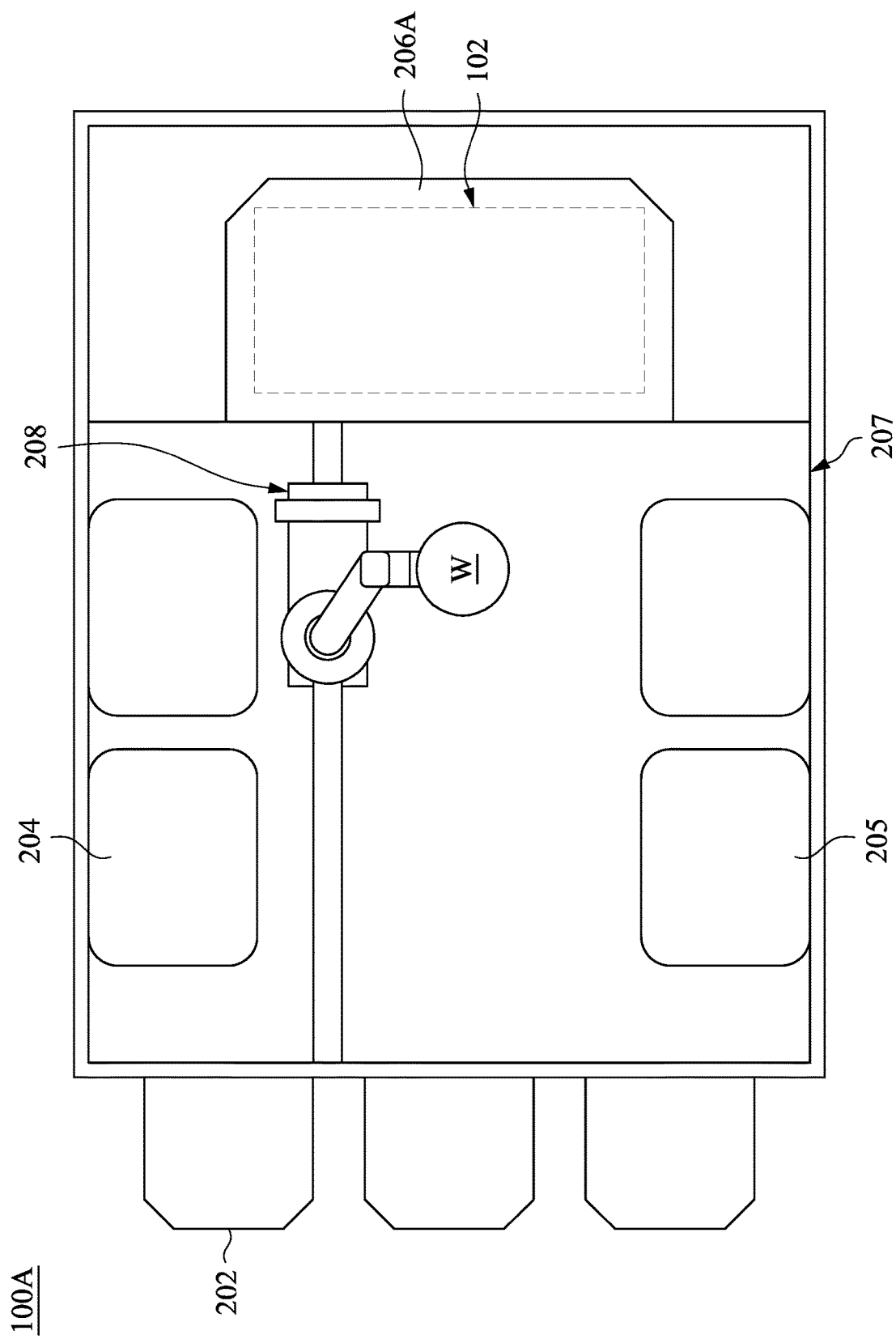
FIG. 1 is a block diagram of a bonding tool in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a block diagram of a bonding tool 100A in accordance with some embodiments of the present disclosure. The bonding tool 100A includes at least one front opening unified pod (FOUP) stage 202, a plasma module 204, a cleaning module 205, a bonding module 206A, a transportation space 207, and a transfer module 208. In some embodiments, the transfer module 208 includes a moving mechanism configured to move a wafer from a module to another module.

In some embodiments, the plasma module 204 receives semiconductor wafer W from a FOUP placed on the FOUP stage 202 by the transfer module 208, so as to perform a plasma operation. In some embodiments, after the plasma operation, the semiconductor wafer W is transferred to the clean module 205 by the transfer module 208, so as to perform a cleaning operation. In some embodiments, after the cleaning operation, the semiconductor wafer W is transferred to the bonding module 206A. The bonding module 206A is used to perform an alignment operation and a bonding operation to bond one semiconductor wafer to another semiconductor wafer. In some embodiments, the bonding tool 100A includes a chamber 102 in the bonding module 206A, and the semiconductor wafer W is transferred to the chamber 102 to perform the alignment operation and the bonding operation. In some embodiments, the transfer module 208 is configured to move bonded wafers from the bonding module 206A to the FOUP stage 202 through the transportation space 207. In some embodiments, the transfer module 208 is configured to move bonded wafers from the bonding module 206A to a wafer carrier through the transportation space 207.

Figure 2:
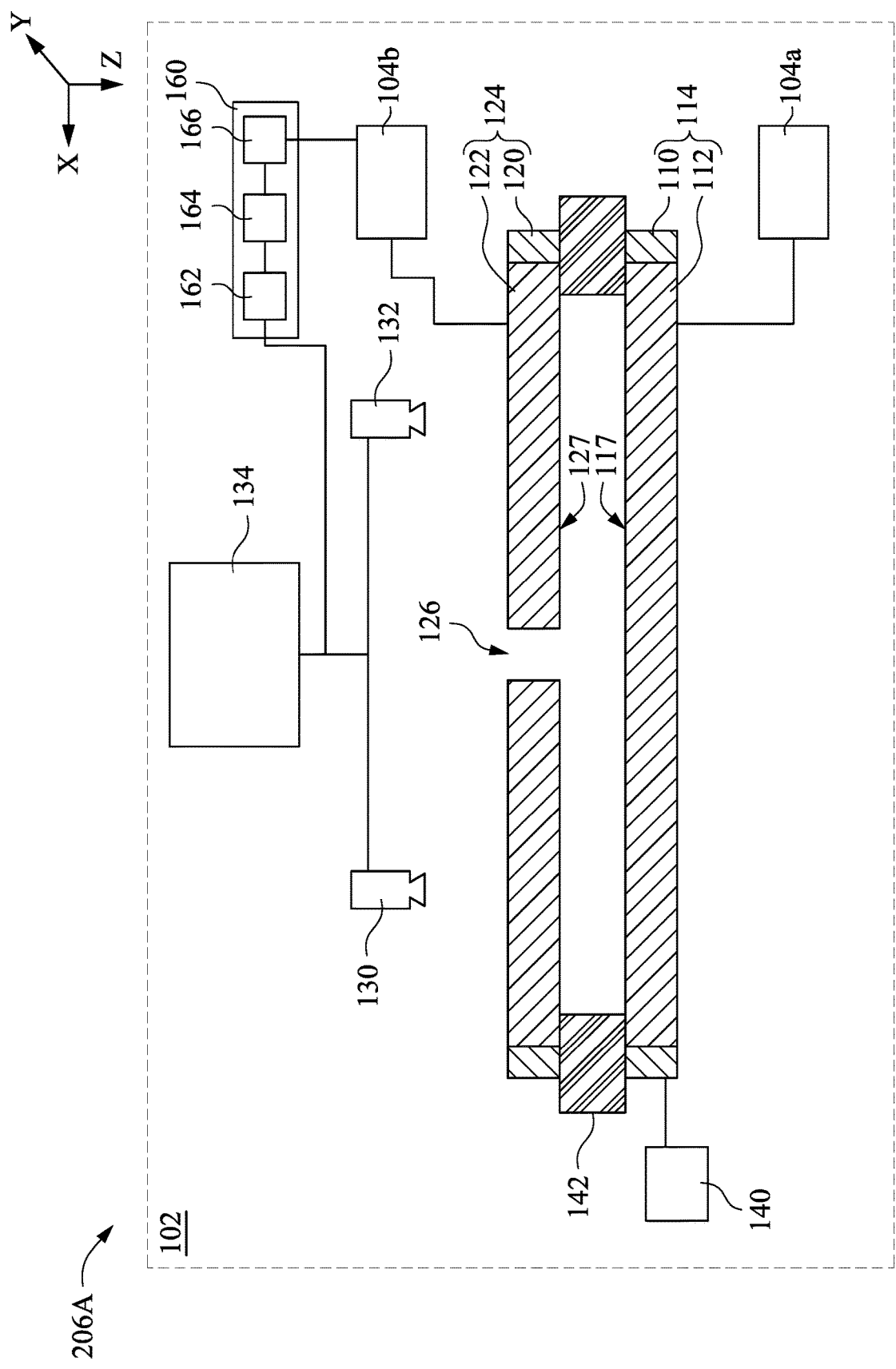
FIG. 2 is a side view of the bonding module in accordance with some embodiments of the present disclosure.

FIG. 2 is a side view of the bonding module 206A in accordance with some embodiments of the present disclosure. The bonding module 206A includes a chamber 102, a first stage 110, a first chuck 112, a second stage 120, a second chuck 122, a first camera 130, a second camera 132, a display unit 134, a adjusting device 140, a measuring device 142, and a controller 160. The first stage 110, the first chuck 112, the second stage 120, the second chuck 122, the first camera 130, the second camera 132, adjusting device 140, and the measuring device 142 are within the chamber 102. In some embodiments, the chamber 102 acts as a process chamber that allows a bonding process to be carried out.

Figure 3B:
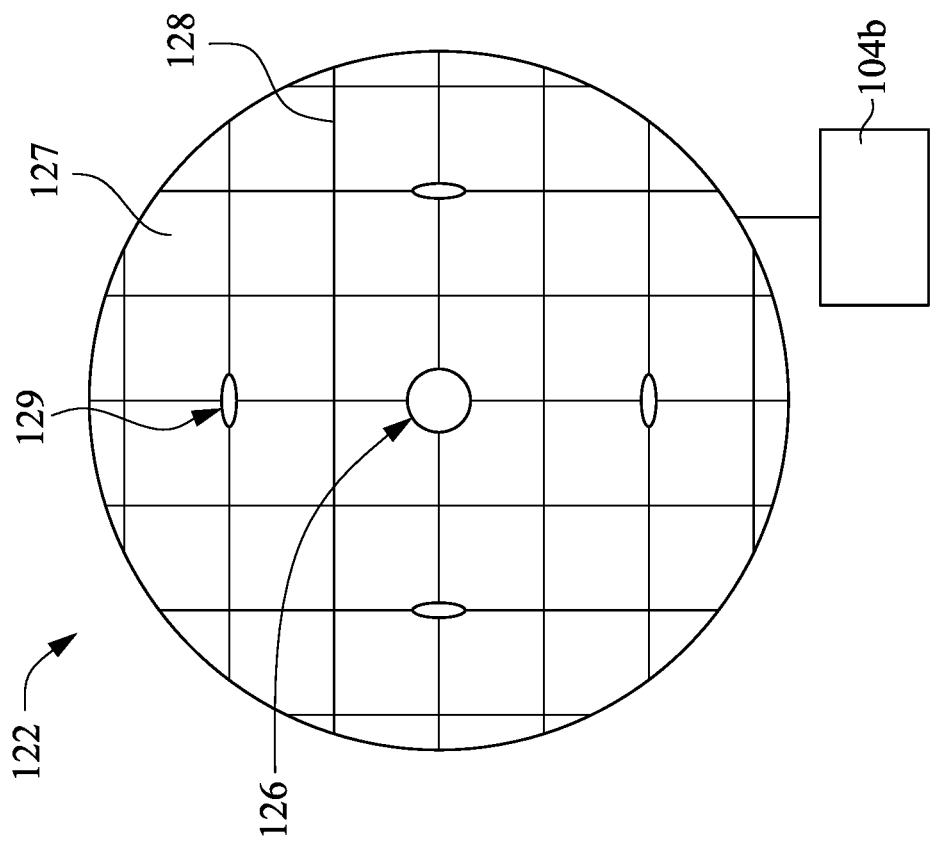
FIG. 3B is a plan view of the second wafer mounting side of the second chuck shown in FIG. 2 in accordance with some embodiments of the present disclosure.
Figure 3A:
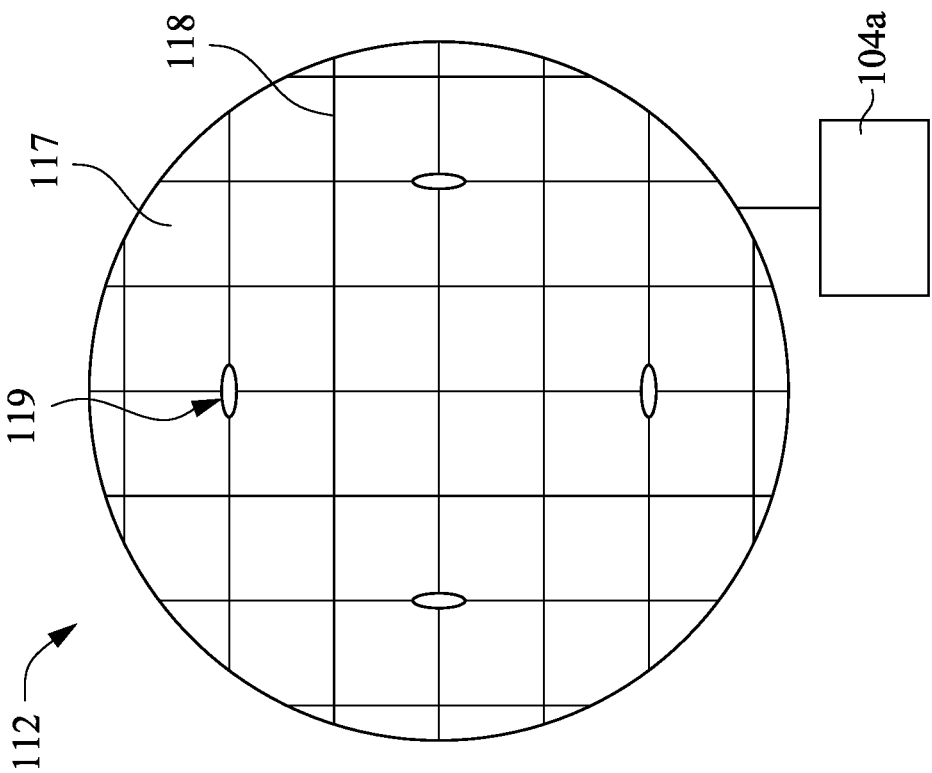
FIG. 3A is a plan view of the first wafer mounting side of the first chuck shown in FIG. 2 in accordance with some embodiments of the present disclosure.
Figure 4:
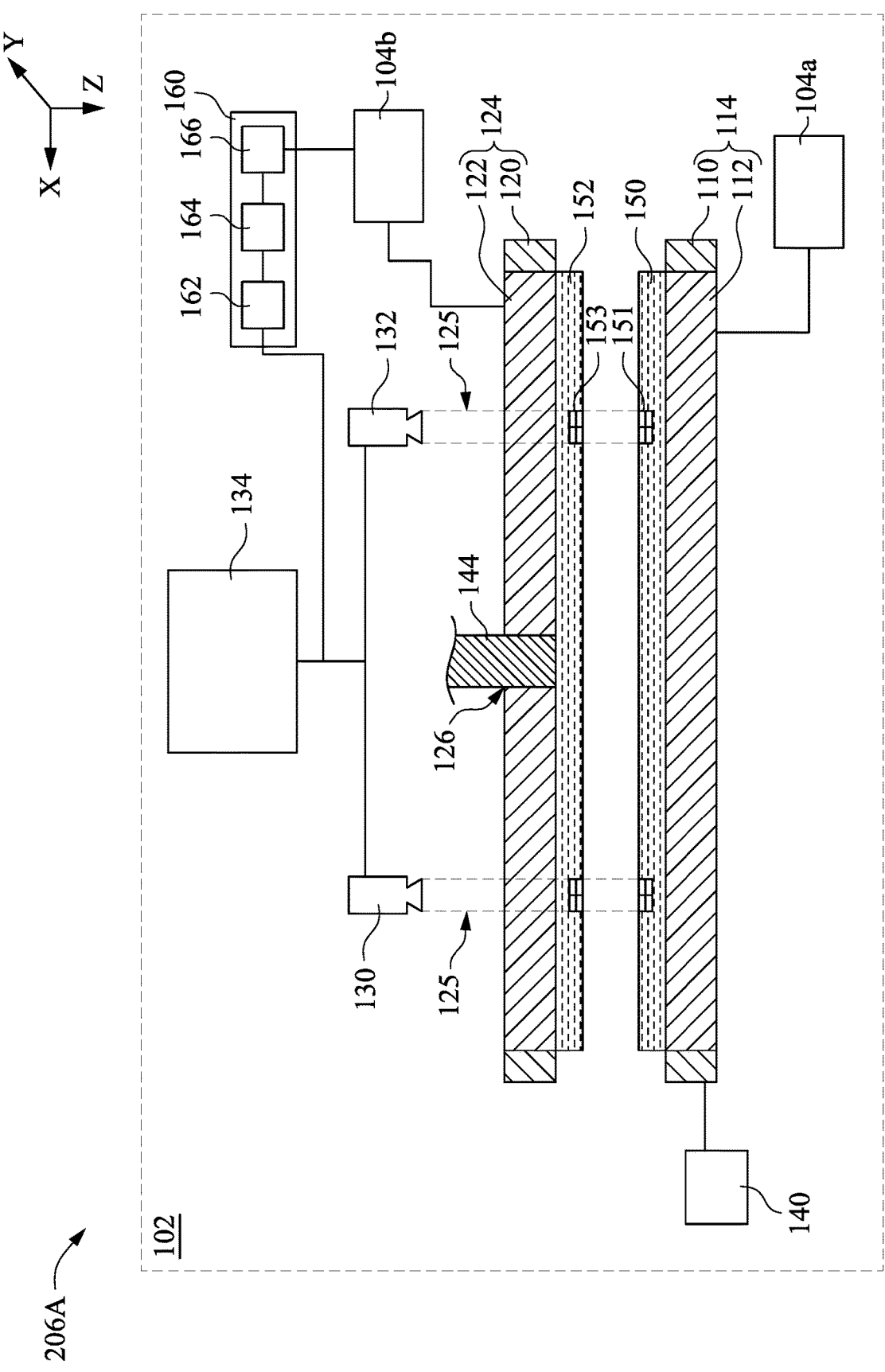
FIGS. 4 through 6 are side views illustrating a method for bonding wafers together using the bonding module shown in FIG. 2 at various stages in accordance with some embodiments of the present disclosure.

The first chuck 112 is mounted on or attached to the first stage 110, and the second chuck 122 is mounted on or attached to the second stage 120. The first stage 110 and the first chuck 112 are also referred to herein collectively as a first wafer support 114 configured to hold the a wafer, and the second stage 120 and the second chuck 122 are also referred to herein collectively as a second wafer support 124 configured to hold the another wafer. The first wafer support 114 and the second wafer support 124 are opposite to each other. The first wafer support 114 is also referred to herein as a bottom wafer support, and the second wafer support 124 is also referred to herein as a top wafer support. The first chuck 112 is adapted to support a first wafer (e.g., a first wafer 150 as shown in FIG. 4), and the second chuck 122 is adapted to support a second wafer (e.g., a second wafer 152 shown in FIG. 4). The second chuck 122 includes an aperture 126 formed therein that extends from one side to the other side of the second chuck 122. The aperture 126 is disposed proximate a substantially central region of the second chuck 122. The aperture 126 is adapted to accommodate a pin (e.g., a pin 144 shown in FIG. 4). During a bonding process for the first wafer and the second wafer, pressure is applicable using the pin 144 through the aperture 126 to the second wafer 152. The first chuck 112 and the second chuck 122 also include vacuum holes 119 and 129 in some embodiments (e.g. holes 119 and 129 shown in FIGS. 3A and 3B).

In some embodiments, the first chuck 112 and the second chuck 122 are substantially transparent. For example, the first chuck 112 and the second chuck 122 may comprise glass, quartz, or other type of transparent material. In some embodiments, the first chuck 112 and the second chuck 122 may comprise a translucent or opaque material. In some embodiments, the first chuck 112 is substantially transparent, and the second chuck 122 is translucent or opaque, or vice versa. In embodiments wherein at least the second chuck 122 comprises a substantially transparent material, the alignment of the first and second wafers is improved due to increased visibility of bond alignment marks on the first and second wafers.

In some embodiments, the first chuck 112 and the second chuck 122 include a tessellation pattern disposed thereon. The tessellation pattern is disposed on a first wafer mounting side 117 of the first chuck 112 and a second wafer mounting side 127 of the second chuck 122. FIG. 3A is a plan view of the first wafer mounting side 117 of the first chuck 112 shown in FIG. 2 in accordance with some embodiments of the present disclosure. FIG. 3B is a plan view of the second wafer mounting side of the second chuck 122 shown in FIG. 2 in accordance with some embodiments of the present disclosure.

As illustrated in FIGS. 3A and 3B, the tessellation pattern comprises a plurality of tessellation cuts 118 and 218 arranged in an array, such as an "x by y" grid pattern. In some embodiments, the tessellation cuts 118 and 218 may be arranged in other shapes or patterns. In some embodiments, the tessellation pattern comprising the tessellation cuts 118 and 218 facilitates an application of a uniform vacuum to the first wafer and the second wafer. In some embodiments, the vacuum is used to hold the first wafer and the second wafer in position on the first chuck 112 and the second chuck 122, in which the vacuum is provided by vacuum pumps 104a and 104b of the bonding tool 100A. In some embodiments, the first chuck 112 and the second chuck 122 are connected to different vacuum pumps respectively. In some embodiments, the first chuck 112 and the second chuck 122 are connected to the same vacuum pump. In some embodiments, the vacuum pumps 104a and 104b are in communication with the holes 119 and 129. The vacuum is applied to the first wafer and the second wafer through vacuum holes 119 and 129, respectively. The holes 119 extend through opposite major surfaces of the first chuck 112, and the holes 129 extend through opposite major surfaces of the second chuck 122, shown in FIGS. 3A and 3B.

Referring again to FIG. 2, in accordance with some embodiments, the first camera 130 and the second camera 132 for monitoring the first wafer and the second wafer are disposed proximate the second wafer support 124, and thus each of the first camera 130 and the second camera 132 is in a position higher than the first wafer support 114 and the second wafer support 124.

In some embodiments, the first camera 130 and the second camera 132 are directed toward a space between the first wafer support 114 and the second wafer support 124. In some embodiments, the first camera 130 and the second camera 132 are configured to monitor statuses of the first wafer and the second wafer, such as monitoring alignment of the first wafer and the second wafer and monitoring whether a defect is present between the first wafer and the second wafer after the bonding.

In some embodiments, at least one of the first camera 130 and the second camera 132 comprises an infrared (IR) charge coupled device (CCD) scope. In some embodiments where at least one of the first camera 130 and the second camera 132 comprises the IR CCD scope, the IR CCD scope is used for detecting IR light with wavelength in a range from about 800 nm to about 2500 nm. Accordingly, at least one of the first camera 130 and the second camera 132 is also referred to herein as an infrared camera. In some embodiments, at least one of the first camera 130 and the second camera 132 comprises an IR CCD scope comprising an IR live CCD adapted to emit reflective infrared (RIR) or transparent infrared (TIR) energy, as another example. In some embodiments, at least one of the first camera 130 and the second camera 132 may comprise other types of monitoring and detection equipment.

In some embodiments, the display unit 134 is coupled to the first camera 130 and the second camera 132. In some embodiments, the first camera 130 and the second camera 132 are electrically connected to the display unit 134 for displaying images captured by the first camera 130 and the second camera 132. In some embodiments, the images displayed by the display unit 134 are real-time images of the first wafer and the second wafer in the chamber 102. In some embodiments, the display unit 134 is also referred to herein as a screen. In some embodiments, the display unit 134 displays the images in a gray-scale mode.

In some embodiments, the adjusting device 140 for adjusting a position of the first wafer support 114 is coupled to the first wafer support 114. In some embodiments, the adjusting device 140 may be coupled to the second wafer support 124 rather than the first wafer support 114 for adjusting a position of the second wafer support 124. In some embodiments, the adjusting device 140 may be coupled to the first wafer support 114 and the second wafer support 124. In some embodiments, the adjusting device 140 comprises a piezoelectric motor or a linear motor. In some embodiments, the adjusting device 140 may comprise other types of motors. In some embodiments, the adjusting device 140 is adapted to control rotation and/or translation of the first wafer support 114, so as to adjust an x position, a y position, a z position, and/or an angular position of the first wafer support 114.

In some embodiments, the measuring device 142 is coupled between the first wafer support 114 and the second wafer support 124 for measuring a distance the first wafer support 114 and the second wafer support 124 before a bonding process of the first wafer and the second wafer. In some embodiments, the measuring device 142 is configured to measure a height of the space between the first wafer support 114 and the second wafer support 124. In some embodiments, the first wafer support 114 and the second wafer support 124 are calibrated by measuring device 142. In some embodiments, the measuring device 142 is attached to the first wafer support 114 and the second wafer support 124. In some embodiments, the measuring device 142 is removed from the space between the first wafer support 114 and the second wafer support 124 at the beginning of the bonding process of the first wafer and the second wafer.

In some embodiments, the controller 160 includes a signal transmitter 162, a trigger 164 and a detector 166. The signal transmitter 162 is electrically coupled to at least one of the first camera 130 and the second camera 132. In some embodiments, the signal transmitter 162 is configured to send a trigger signal to at least one of the first camera 130 and the second camera 132, so as to activate at least one of the first camera 130 and the second camera 132 to capture an image in a field of view (FOV) of the at least one of first and second cameras 130 and 132. For example, after performing the bonding process, the signal transmitter 162 can send the trigger signal to the first camera 130 to trigger the first camera 130 to capture an image of the bonded first and second wafers.

In some embodiments, the signal transmitter 162 is electrically coupled to the trigger 164, the detector 166 is electrically coupled to the trigger 164, and the detector 166 is electrically coupled to the vacuum pump 104b as well. In some embodiments, the controller 160 is configured to control the vacuum pump 104b. For example, the controller 160 is able to control a suction force to vacuum holes (e.g. 119 and/or 129) exerted by the vacuum pump 104b, such that a suction force from the vacuum pump 104b can be reduced. Alternatively, the vacuum pump 104b can be turned off to stop exerting the vacuum force. In some embodiments, the detector 166 is configured to detect whether the suction force from the vacuum pump is reduced. The trigger 164 is configured to control the signal transmitter 162 to transmit the trigger signal to the first camera 130 and/or the second camera 132 according to a detection result of the detector 166. For example, when a suction force from the vacuum pump 104b is detected to be reduced, the trigger 164 is able to control the signal transmitter 162 to send the trigger signal to the first camera 130 or the second camera 132, so as to activate or trigger the first camera 130 or the second camera 132 to capture an image. Accordingly, the controller 160 is configured to reduce the suction force exerted by the vacuum pump 104b such that the second wafer on the second wafer support 124 held by the suction force can be released. After reducing the suction force and in turn releasing the second wafer, the controller 160 is configured to control the cameras to capture the image of the first and second wafers.

Figure 5:
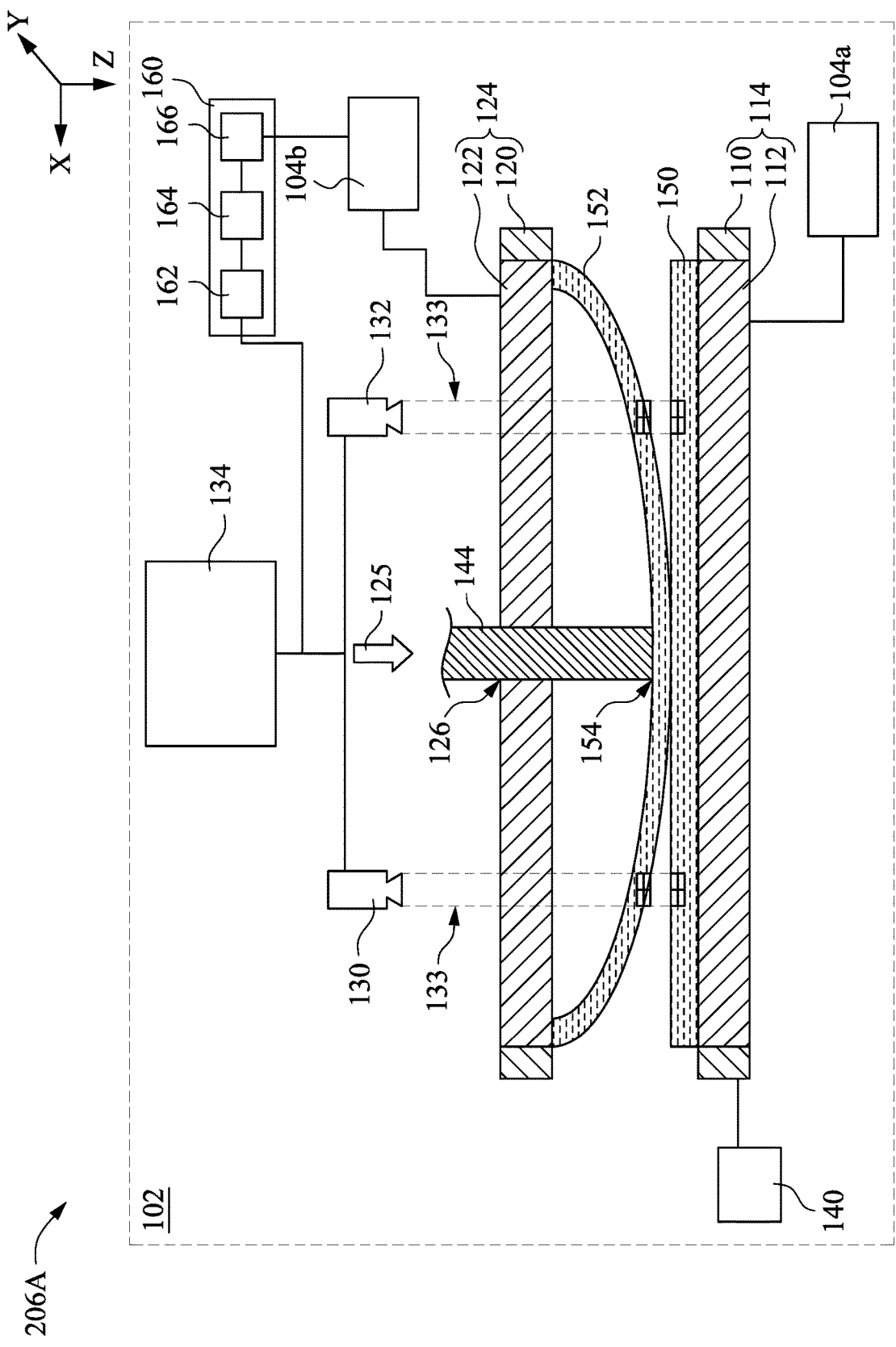
Figure 6:
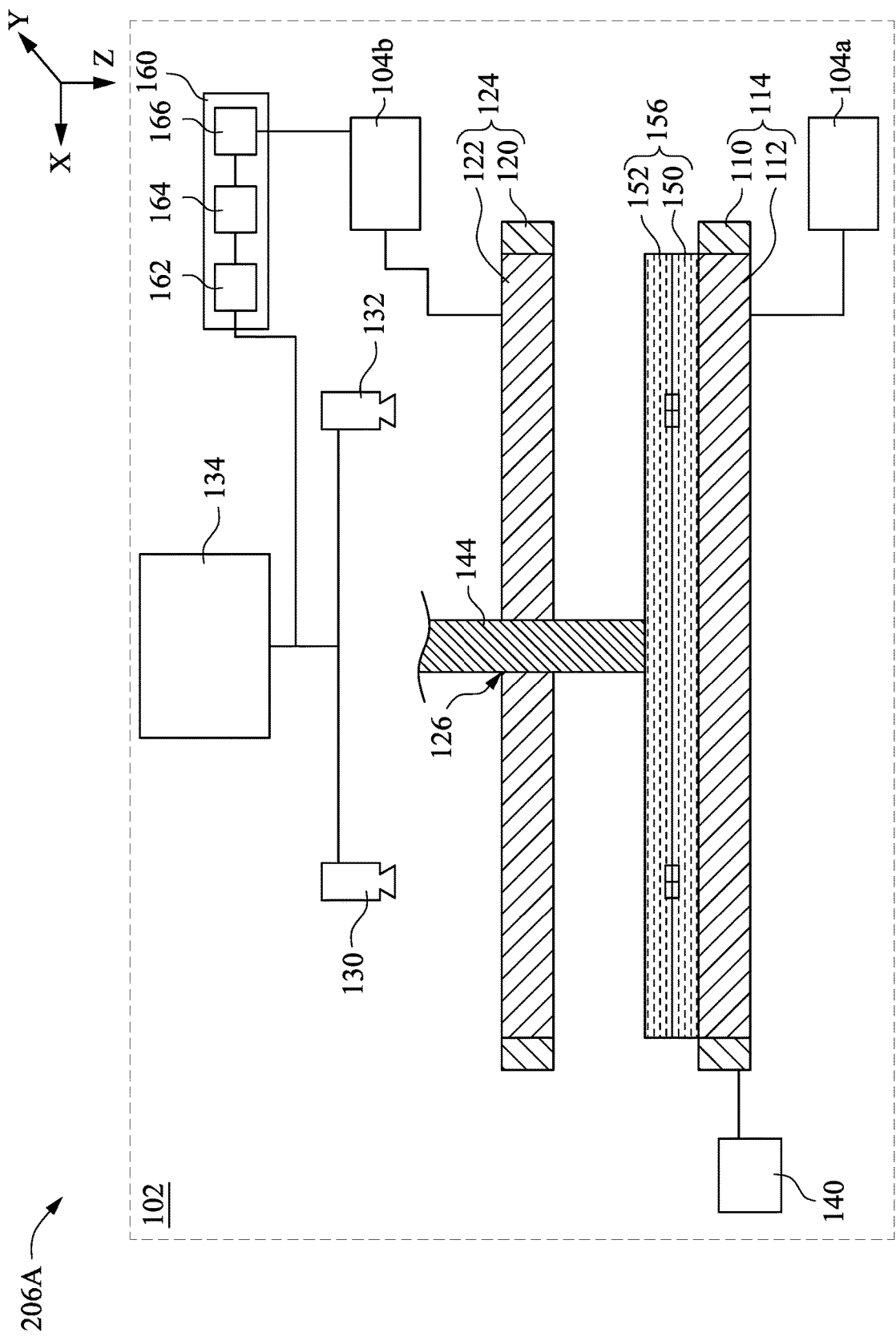

FIGS. 4 through 6 are side views illustrating a method for bonding wafers together using the wafer bonding module 206A shown in FIG. 2 at various stages in accordance with some embodiments of the present disclosure. The method for bonding the first wafer 150 and the second wafer 152 together by using the bonding module 206A shown in FIG. 2 is performed. In some embodiments, before placing the first wafer 150 on the first wafer support 114 and placing the second wafer 152 on the second wafer support 124, the first wafer 150 and the second wafer 152 undergo a plasma process performed in the plasma module 204. The plasma process activates the wafer surface and facilitates the bonding process. In some embodiments, the first wafer 150 and the second wafer 152 are cleaned in the cleaning module 205 after the plasma process. The cleaning process may comprise using cleaning arms, a drain system, and a spin module to keep the wafer surface clean and activated, as examples. A cleaning solvent including deionized (DI) water, acid, and/or alkalinity can be used to remove/protect the bonding surface, for example. In some embodiments, other cleaning solvents and processes may be used.

As shown in FIG. 4, the first wafer 150 is placed on or coupled to the first wafer support 114, and the second wafer 152 is placed on or coupled to the second wafer support 124. In some embodiments, the first wafer 150 is also referred to herein as a bottom wafer, and the second wafer 152 is also referred to herein as a top wafer. In some embodiments, the first wafer 150 and the second wafer 152 may be held onto or retained onto the first wafer support 114 and the second wafer support 124, respectively, by a suction force exerted through the vacuum holes 119 and 129 shown in FIGS. 3A and 3B. In some embodiments, other methods or devices may also be used to retain the first wafer 150 and the second wafer 152 onto the first wafer support 114 and the second wafer support 124. The second wafer support 124 is inverted and disposed over the first wafer support 114, as shown in FIG. 4. A pin 144 extends through the aperture 126 in the second chuck 122. In some embodiments, the first wafer 150 includes first bonding alignment marks 151 formed thereon, and the second wafer 152 includes second bonding alignment marks 153 formed thereon.

In some embodiments, the first camera 130 and the second camera 132 are activated to emit IR energy 133 through in sequence the second chuck 122, the second wafer 152, the second bonding alignment marks 153 on the second wafer 152, and the first bonding alignment marks 151 on the first wafer 150. In some embodiments, the adjusting device 140 can receive the information regarding the location of the first bonding alignment marks 151 from the first camera 130 and the second camera 132 and adjusts the position of the first wafer 150 relative to the position of the second wafer 152 to perform an initial coarse alignment of the first wafer 150 and the second wafer 152. The second wafer support 124 is then lowered towards the first wafer support 114 until the second wafer 152 contacts the first wafer 150, as shown in FIG. 5.

In some embodiments, a fine alignment is then performed to the second wafer 152 and the first wafer 150 using the first camera 130 and the second camera 132 which continue to emit the IR energy 133. In some embodiments, the adjusting device 140 is adapted to adjust the position of the first wafer support 114, such as adjusting an x position, a y position, a z position, and/or an angular position of the first wafer support 114.

As shown in FIG. 5, a force is then exerted on a substantially central region of the second wafer 152 using the pin 144 which is lowered through the aperture 114 in the second chuck 122. In some embodiments, a force 125 is exerted on the pin 144, creating pressure against the second wafer 152 and causing the second wafer 152 to bend or bow towards the first wafer 150 as shown by a bowed region 154 of the second wafer 152 in FIG. 5. The amount of the bowing in the bowed region 154 of the second wafer 152 is exaggerated in FIG. 5. In some embodiments, the amount of the bowing may not be visually noticeable. In some embodiments, the force 125 exerted to the pin 144 makes the pin 144 to push against the second and first wafers 152 and 150.

When the pressure is exerted during the bonding process for the first wafer 150 and the second wafer 152, the fine alignment of the second wafer 152 to the first wafer 150 is continued using the first camera 130, the second camera 132, and the adjusting device 140. In some embodiments, continuing to align the second wafer 152 to the first wafer 150 using the first camera 130, the second camera 132, and the adjusting device 140 comprises an in-situ and real-time alignment compensation process during the bonding process. The pressure of the pin 144 causes the second wafer 152 to press against the first wafer 150, facilitating in the bonding process of the first wafer 150 and the second wafer 152. In some embodiments, the second wafer 152 is pressed against the first wafer 150 for a period of time. In some embodiments, the first and second wafers 150 and 152 are heated using a heat source (not shown) during exertion of the force 125.

As shown in FIG. 6, after a predetermined time period of applying the pressure, the heat source stops heating the wafers 150 and 152, and the second wafer 152 is released from the second wafer support 124. In some embodiments, a suction force from the vacuum pump 104b is reduced, and hence the second wafer 152 can be released from the second wafer support 124. Then, the second wafer 152 released from the second wafer support 124 falls to the first wafer 150, and the first wafer 150 and the second wafer 152 are then bonded together to form bonded wafers 156. In some embodiments, during the bonding process, the second wafer 152 is bonded to the first wafer 150 with the first wafer 150 coupled to the first wafer support 114. In some embodiments, the pin 144 is retracted away from the second wafer 152 of the bonded wafers 156, which in turn will terminate the pressing of the second wafer 152 against the first wafer 150.

In some embodiments, after the first wafer 150 and the second wafer 152 are bonded together to form the bonded wafers 156, the first camera 130 and the second camera 132 are used for detecting whether a bubble is between the first wafer 150 and the second wafer 152 of the bonded wafers 156. In some embodiments, the first camera 130 and the second camera 132 can detect a bubble having a diameter greater than about 0.1 mm. When the bubble detected by the first camera 130 and the second camera 132 has a diameter greater than about 15 mm, the first wafer 150 and the second wafer 152 will be scrapped to avoid the costs of further processing. When a bubble is detected by the first camera 130 and the second camera 132 and has a diameter smaller than about 15 mm, the first wafer 150 and the second wafer 152 will be further processed. For example, in some embodiments, the bobble portion of the first wafer 150 and the second wafer 152 will be cut out. In some embodiments, the first wafer 150 and the second wafer 152 of the bonded wafers 156 are coupled to the first wafer support 114 during the detecting. For example, the detecting is performed after removing the second wafer 152 from the second wafer support 124 and before removing the first wafer 150 from the first wafer support 114. In some embodiments, the bonding process and the detecting process are in-situ performed. For example, bonding the first and second wafers 150, 152, and detecting whether a bubble is between the first and the second wafers 150 and 152 are performed in the same chamber 102.

In some embodiments, detecting whether a bubble is between the first wafer 150 and the second wafer 152 of the bonded wafers 156 is performed after the suction force exerted to the second wafer 152 is reduced. In some embodiments, the reducing the suction force includes turning off the vacuum pump 104b. For example, when the suction force from the vacuum pump 104b is reduced, the status of the vacuum pump 104b can be detected by the detector 166, and the trigger 164 is able to control the signal transmitter 162 to transmit the trigger signal to the first camera 130 and the second camera 132, so as to activate the first camera 130 and the second camera 132 to detect whether a bubble is between the first wafer 150 and the second wafer 152 of the bonded wafers 156.

In some embodiments, the detecting is performed by capturing an image of the first wafer 150 and the second wafer 152 of the bonded wafers 156. In some embodiments, capturing the image of the first wafer 150 and the second wafer 152 of the bonded wafers 156 is performed after releasing the first wafer 150 from the first wafer support 114. Accordingly, in some embodiments, the signal transmitter 162 can send trigger signals to the first camera 130 and the second camera 132, so as to activate the first camera 130 and the second camera 132 to capture images. For example, when a suction force from the vacuum pump 104b is reduced, the status of the vacuum pump 104b can be detected by the detector 166, and the trigger 164 is able to control the signal transmitter 162 to transmit trigger signals to corresponding first camera 130 and the second camera 132, so as to trigger the first camera 130 and the second camera 132 to capture the image of the first wafer 150 and the second wafer 152 of the bonded wafers 156. Therefore, the detecting whether a bubble is between the first wafer 150 and the second wafer 152 of the bonded wafers 156 is performed by the capturing the image of the first wafer 150 and the second wafer 152 of the bonded wafers 156, and the capturing the image is performed after the suction force from the vacuum pump 104b is reduced.

In some embodiments, the detecting is performed by optical detection. For example, the detecting is performed by Fourier transform infrared microscopy (FTIR), xray reflection (XRR), nuclear reaction analysis (NRA), or combinations thereof. In some embodiments, a depth of field of the image comprises an interface between the first wafer 150 and the second wafer 152 of the bonded wafers 156.

In some embodiments, the image of the first wafer 150 and the second wafer 152 of the bonded wafers 156 is captured by at least one of the first camera 130 and the second camera 132. Since the detecting is performed by capturing the image of the first wafer 150 and the second wafer 152 of the bonded wafers 156 by at least one of the first camera 130 and the second camera 132, the detecting is referred to as a non-contact detection. For example, at least one of the first camera 130 and the second camera 132 is also referred to herein collectively as an optical detector, and the optical detector is not in contact with the first wafer 150 and the second wafer 152 of the bonded wafers 156 during the detecting. In some embodiments, during capturing the image of the first wafer 150 and the second wafer 152 of the bonded wafers 156, at least one of the first camera 130 and the second camera 132 are focused on the interface between the first wafer 150 and the second wafer 152 of the bonded wafers 156.

In some embodiments where the first camera 130 and the second camera 132 are disposed proximate the second wafer support 124, the detecting performed by at least one of the first camera 130 and the second camera 132 comprises capturing the image of the first wafer 150 and the second wafer 152 of the bonded wafers 156 from a position above the second wafer 152. In some embodiments, at least one of the first camera 130 and the second camera 132 comprises the IR CCD, and thus the image is captured using infrared light.

In some embodiments where at least the second chuck 122 comprises a transparent material, the transparent second chuck 122 intensifies the IR energy 133 resolution. In some embodiments where the first chuck 112 and the second chuck 122 comprise glass or quartz, good transparency is provided for the IR energy 133 to "see" the interface between the first wafer 150 and the second wafer 152 of the bonded wafers 156. In some embodiments, the image of the first wafer 150 and the second wafer 152 of the bonded wafers 156 can be transferred to the display unit 134 for showing the image of the first wafer 150 and the second wafer 152 of the bonded wafers 156, thereby determining whether a bubble is present between the first wafer 150 and the second wafer 152 of the bonded wafers 156. In some embodiments, the image of the first wafer 150 and the second wafer 152 of the bonded wafers 156 shown in the display unit 134 is in the gray-scale mode.

In some embodiments, after the detecting and the determining whether a bubble is present between the first wafer 150 and the second wafer 152 of the bonded wafers 156, the first wafer 150 and the second wafer 152 of the bonded wafers 156 are unloaded from the first wafer support 114 and removed from the bonding module 206A, if a result of the detecting shows no bubble is present in the image of the first wafer 150 and the second wafer 152 of the bonded wafers 156. Then, the bonded wafers 156 are moved to a subsequent process tool or chamber. In addition, another pair of wafers are allowed to be loaded into the bonding module 206A and a bonding process as discussed above is performed on the pair of wafers. With the detecting and the determining, the yield rate of the wafer fabrication is improved.

In some embodiments, after the detecting and the determining whether a bubble is present between the first wafer 150 and the second wafer 152 of the bonded wafers 156, another pair of wafers are not allowed to be loaded into the bonding module 206A, if a result of the detecting shows a bubble in the image of the first wafer 150 and the second wafer 152 of the bonded wafers 156. Moreover, when a bubble is detected to be present between the first wafer 150 and the second wafer 152, a cleaning process can be performed, and the bonded wafers 156 can be transferred to the cleaning module 205 to be cleaned. In some embodiments, during the cleaning process, at least one of the first wafer support 114 and the second wafer support 124 is cleaned to remove pollutants, such as removing particles from surfaces of the first wafer support 114 and the second wafer support 124. In some embodiments, when a bubble between the first wafer 150 and the second wafer 152 is detected, the operation of the bonding module 206A is stopped. For example, the vacuum pump 104a is stopped or terminated, and hence no suction force is applied to the first wafer 150. In addition, when the operation of the bonding module 206A is stopped, no wafer is delivered to the bonding module 206A. In some embodiments, another pair of wafers which stand by for another bonding processing are loaded into the chamber 102 of the bonding tool accommodating the first and second wafer supports 114 and 124 after performing the clean operation. For example, loading of a third wafer is deferred until the cleaning completes.

Figure 7:
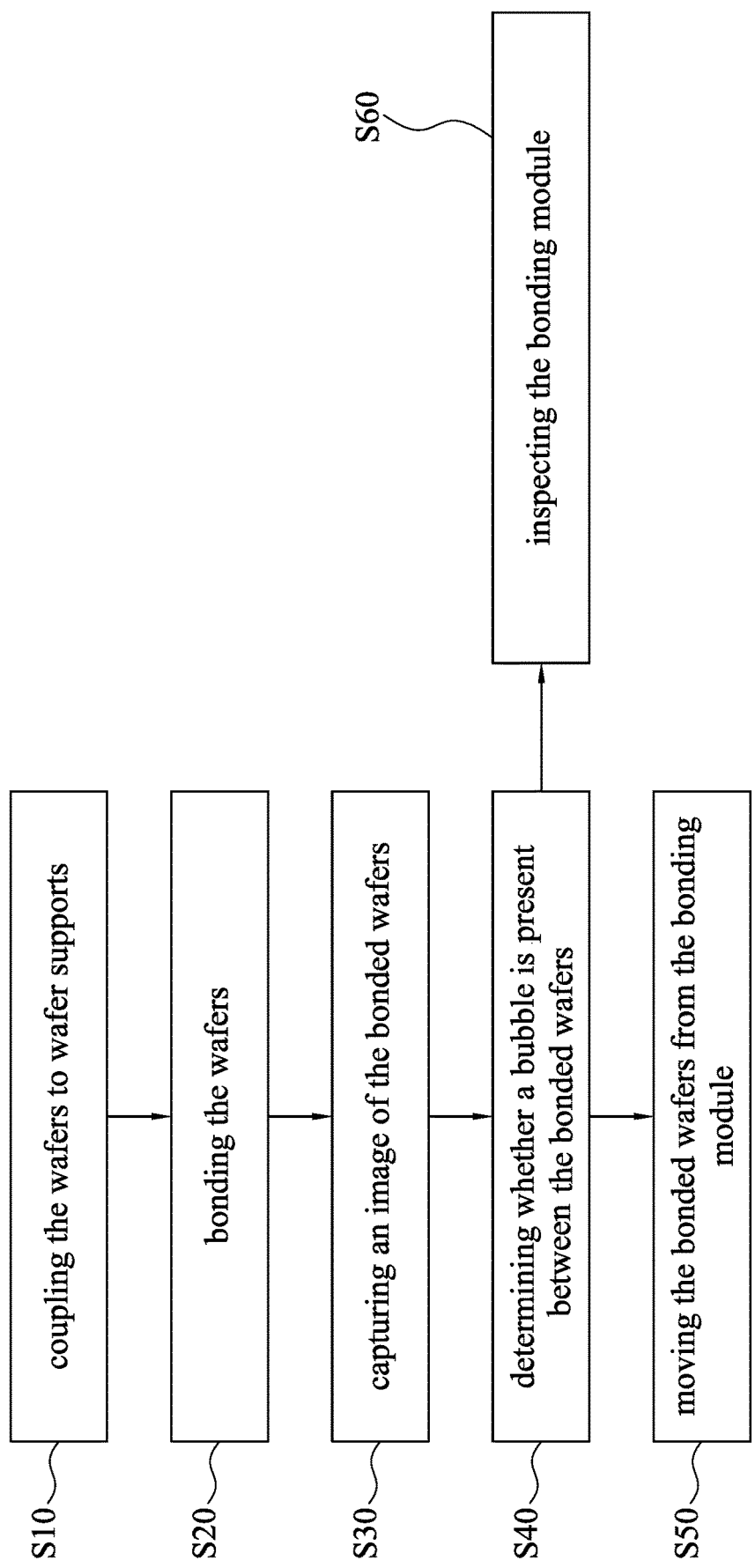
FIG. 7 is a flowchart of operations S10-S60 performed on wafers in a bonding tool in accordance with some embodiments of the present disclosure.

FIG. 7 is a flowchart of operations S10-S60 performed on wafers in a bonding tool in accordance with some embodiments of the present disclosure. The operation S10 involves coupling wafers to wafer supports. The operation S20 involves bonding the wafers. The operation S30 involves capturing an image of the bonded wafers. The operation S40 involves determining whether a bubble is present between the bonded wafers. The operation S50 involves moving the bonded wafers from a bonding module. The operation S60 involves inspecting the bonding module.

In the operation S10, the wafers are placed in a chamber of the bonding tool, and then are respectively coupled to the wafer supports. After the operation S10, the wafers respectively have surfaces facing each other. In the operation S20, the wafers are bonded together. After the operation S20, and the bonded wafers are in contact with and coupled to one of the wafer supports.

In the operation S30, the image of the bonded wafers is captured by an infrared camera, in which the infrared camera captures the images when the bonded wafers are still coupled to the wafer support. After the operation S30, the image of the bonded wafers captured by an infrared camera is transferred to a display unit. In the operation S40, bubbles of the bonded wafers are determined according to the image thereof. For example, the bubble can be distinguished from different contrast ratio in the image. After the operation S40, if the images show the bonded wafers are acceptable, the step continues with the operation S50. For example, if the images show no bubble, the bonded wafers would be acceptable. In the operation S50, the bonded wafers are moved out of a chamber of the bonding module, such that the bonded wafers are delivered to a subsequent process tool, chamber or a space. After the operation S40, if the images show any bubble, the step continues with the operation S60. In the operation S60, the bonding tool is inspected. For example, the bonding module is inspected to determine whether any present of particle is adhered to a surface of at least one of the wafer supports, and then a cleaning process is performed to remove the particle.

Figure 8:
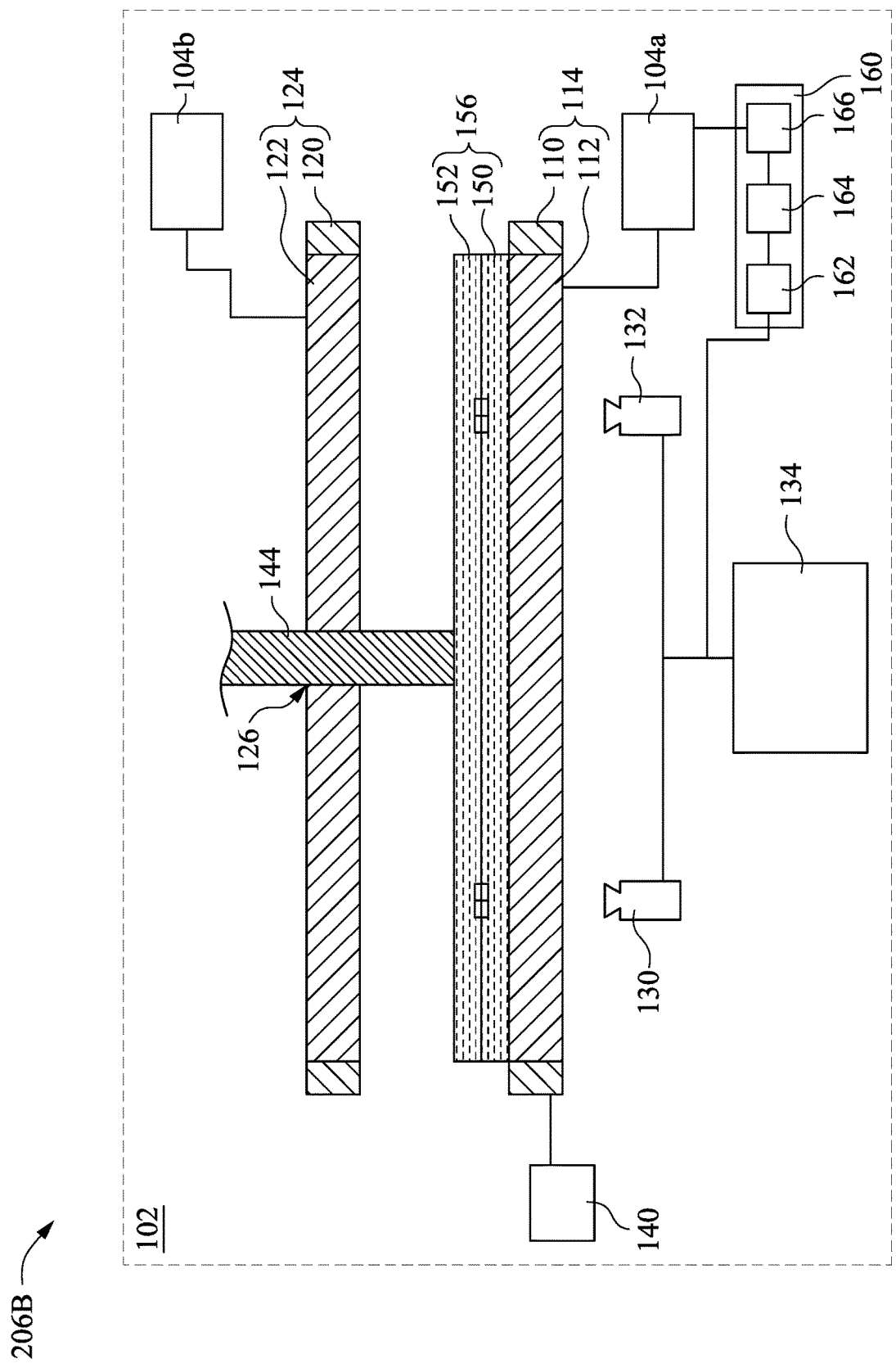
FIG. 8 is a side view of a bonding module in accordance with some embodiments of the present disclosure.

FIG. 8 illustrates another bonding module, bonding module 206B, which shares some of the features of the bonding module 206A. Specifically, the bonding module 206B includes the first and second cameras 130 and 132 substantially as included in the bonding module 206A and described above. Additionally, the first and second cameras 130 and 132 of the bonding module 206B for monitoring the first wafer 150 and the second wafer 152 are disposed proximate the first wafer support 114. Each of the first camera 130 and the second camera 132 is in a position lower than the first wafer support 114 and the second wafer support 124. Accordingly, the detecting of the bubble performed by at least one of the first camera 130 and the second camera 132 comprises capturing the image of the first wafer 150 and the second wafer 152 of the bonded wafers 156 from a position below the first wafer 150.

Figure 9:
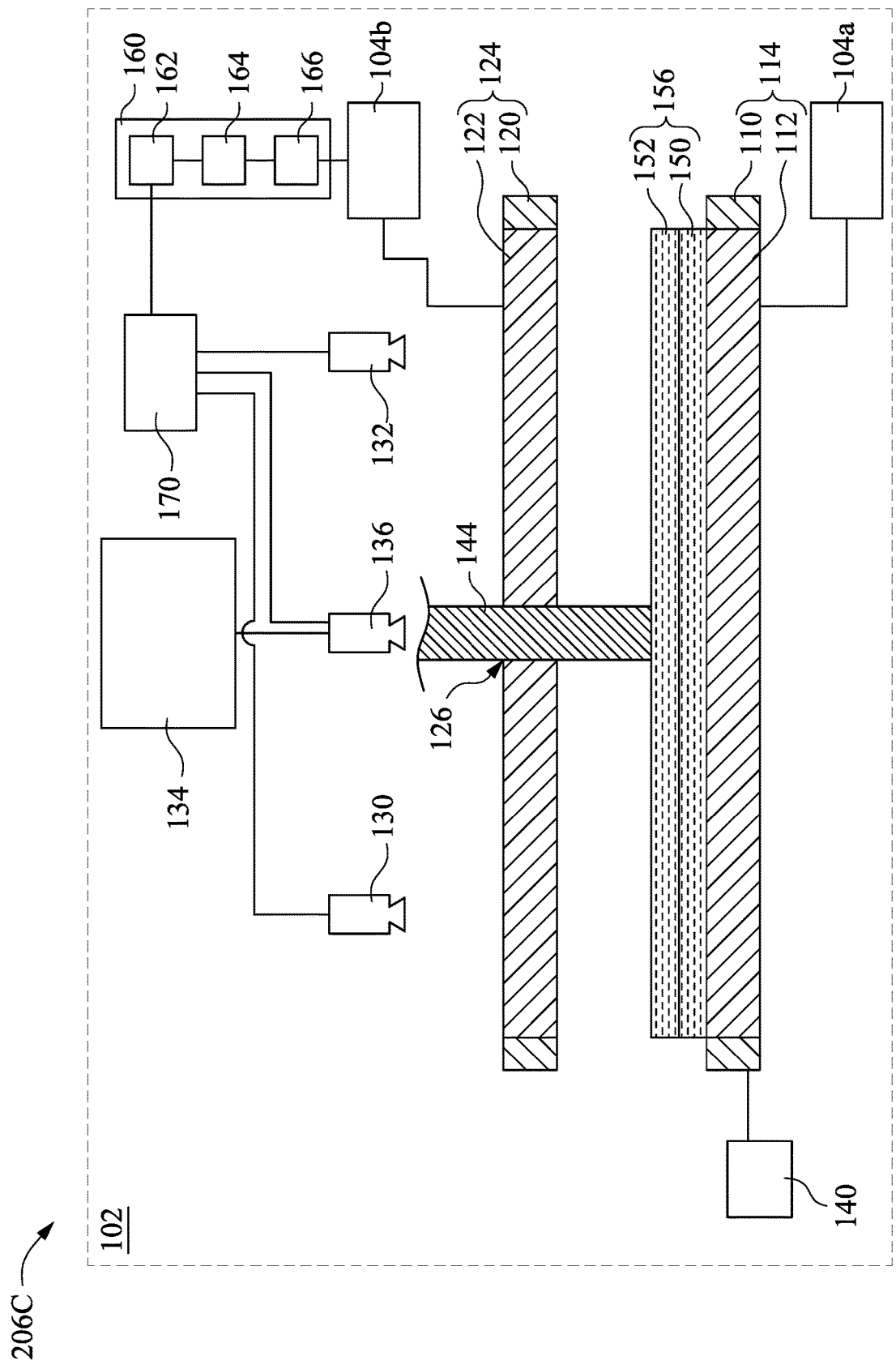
FIG. 9 is a side view of a bonding module in accordance with some embodiments of the present disclosure.

FIG. 9 illustrates another bonding module, bonding module 206C, which shares some of the features of the bonding module 206C. Specifically, the bonding module 206C includes the first and second cameras 130 and 132 substantially as included in the bonding module 206A and described above. Additionally, the bonding module 206C further includes a third camera 136 which is configured to capture an image of a first wafer 150 and a second wafer 152 of bonded wafers 156. In some embodiments, the third camera 136 is an infrared camera. In some embodiments, the image of the first wafer 150 and the second wafer 152 of the bonded wafers 156 captured by the third camera 136 is transmitted to a display unit 134 for displaying. In some embodiments, the first camera 130 and the second camera 132 of the bonding module 206C are activated during a bonding process, and the third camera 136 of the bonding module 206C is activated after performing the bonding process. For example, a camera control unit 170, such as a computer, can be employed to control operations of the first and second cameras 130 and 132 prior to the operation of the third camera 136. In some embodiments, the third camera 136 is electrically coupled to the signal transmitter 162 of the controller 160 through the camera control unit 170, and the signal transmitter 162 of the controller 160 can send a trigger signal to the third camera 136, so as to activate or trigger the third camera 136 to capture an image of the first wafer 150 and the second wafer 152 of the bonded wafers 156.

Figure 10:
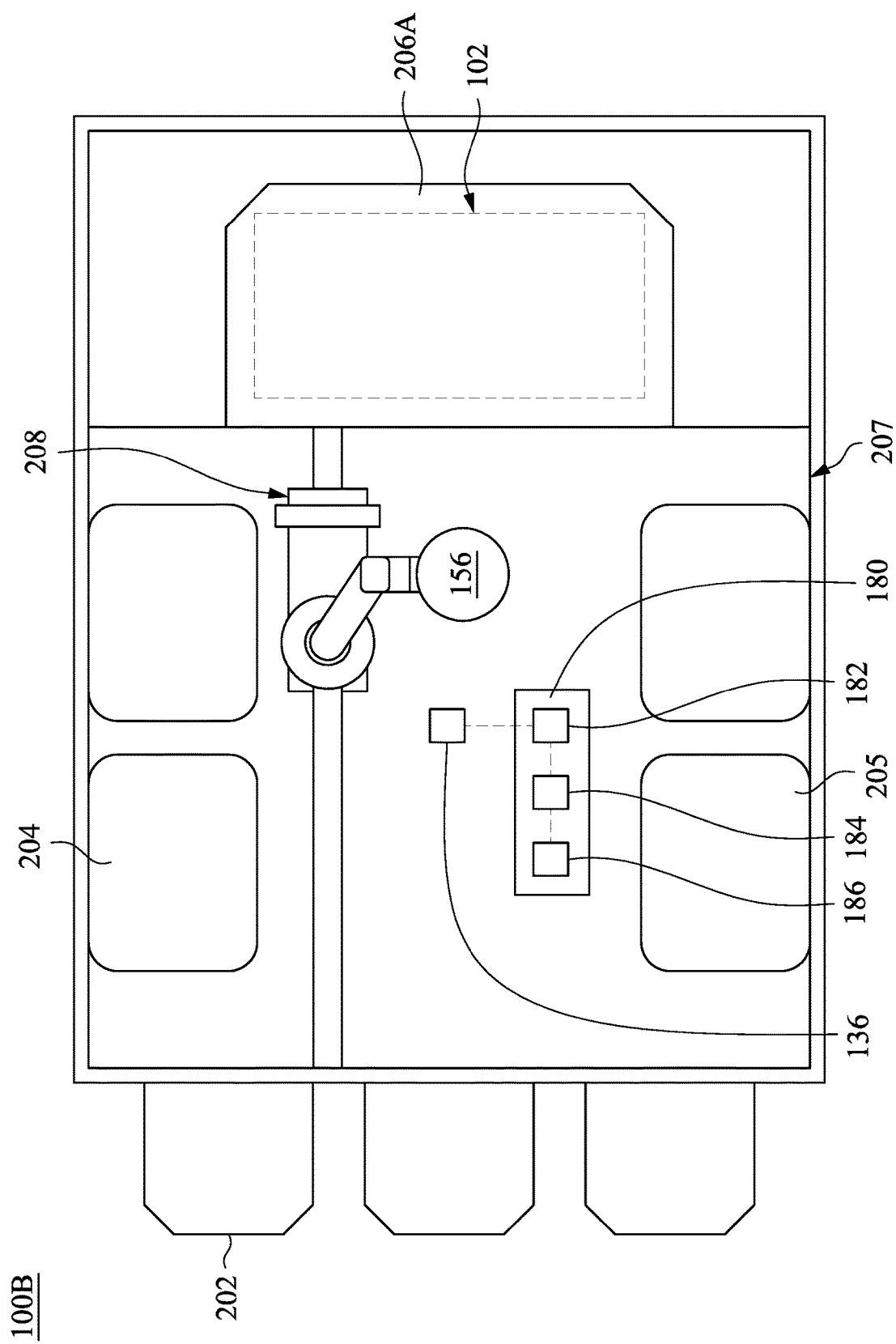
FIG. 10 is a block diagram of a bonding tool in accordance with some embodiments of the present disclosure.

FIG. 10 illustrates another bonding tool, bonding tool 100B, which shares some of some of the features of the bonding tool 100A. Specifically, the bonding tool 100B includes the bonding module 206A substantially as included in the bonding tool 100A as described above. Additionally, the third camera 136 and a controller 180 are within the transportation space 207 and external to the chamber 102 of the bonding module 206A.

In some embodiments, the controller 180 includes a signal transmitter 182, a trigger 184, and a detector 186. The signal transmitter 182 is electrically coupled to the third camera 136 and the trigger 184, and the trigger 184 is electrically coupled to the detector 186. In some embodiments, the detector 186 is configured to detect whether the bonded wafers 156 are present within the transportation space 207, and the trigger 184 is configured to control the signal transmitter 182 to send the trigger signal to the third camera 136 when the bonded wafers 156 are detected to be within the transportation space 207. In some embodiments, the detector 186 includes an optical sensor, and the detector 186 detects whether the bonded wafers 156 are present within the transportation space 207 according to a field of view of the optical sensor. In some embodiments, the detector 186 includes a pressure sensor, and the detector 186 detects whether the bonded wafers 156 are present within the transportation space 207 according to pressure against the pressure sensor from the moving mechanism of the transfer module 208.

In some embodiments, after the bonded wafers 156 are formed in the chamber 102, the bonded wafers 156 are moved from the chamber 102 to the FOUP stage 202 through the transportation space 207 by the moving mechanism of the transfer module 208. In some embodiments, after the bonded wafers 156 are formed in the chamber 102, the bonded wafers 156 are moved from the chamber 102 to the wafer carrier through the transportation space 207 by the moving mechanism of the transfer module 208. As the bonded wafers 156 are moved into the transportation space 207, the bonded wafers 156 can be detected by the detector 186, and then the bonded wafers 156 may remain within the transportation space 207 in a predetermined time period. During the predetermined time period, the bonded wafers 156 are detected to be within the transportation space 207. Then, the signal transmitter 182 can send the trigger signal to the third camera 136, so as to trigger the third camera 136 to capture the image of the bonded wafers 156. Therefore, the detecting whether a bubble is between the bonded wafers 156 is performed when the bonded wafers 156 are in the transportation space 207. In some embodiments, when the third camera 136 captures the image of the bonded wafers 156, the bonded wafers 156 are static in the transportation space 207. In some embodiments, when the third camera 136 captures the image of the bonded wafers 156, the bonded wafers 156 are held by the moving mechanism of the transfer module 208. In some embodiments, after the capturing the image of the bonded wafers 156, the bonded wafers 156 are moved to the FOUP stage 202 or the wafer carrier by the moving mechanism of the transfer module 208.

Figure 11:
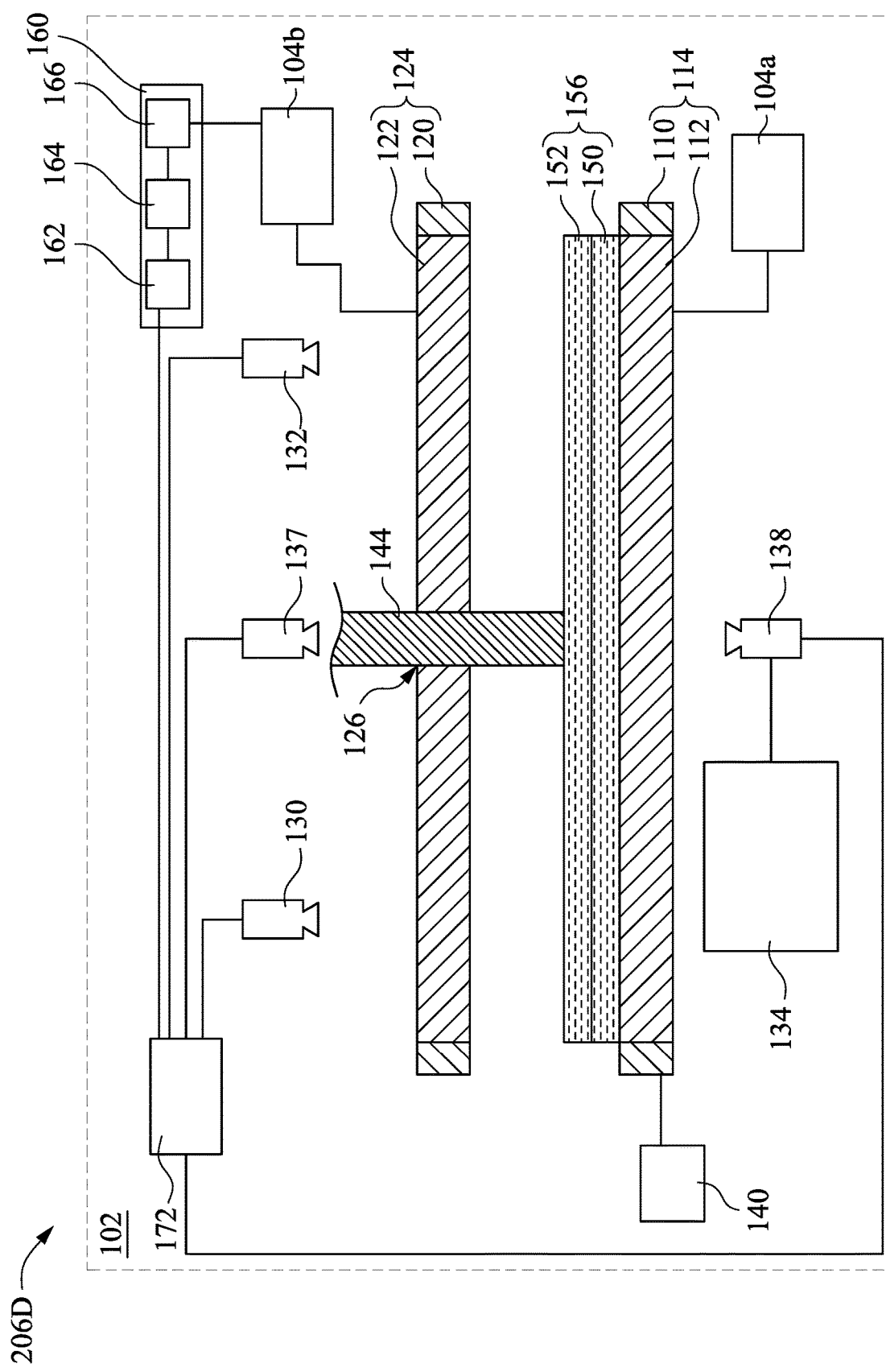
FIG. 11 is a side view of a bonding tool in accordance with some embodiments of the present disclosure.

FIG. 11 illustrates another bonding module, bonding module 206D, which shares some of some of the features of the bonding module 206A. Specifically, the bonding module 206D includes the first and second cameras 130 and 132 substantially as included in the bonding module 206A as described above. Additionally, the bonding module 206D further includes an optical emitter 137 in a position higher than a first wafer support 114 and a second wafer support 124 and an optical receiver 138 in a position lower than the first wafer support 114 and the second wafer support 124. Thus, the first wafer support 114 and the second wafer support 124 are located between the optical emitter 137 and the optical receiver 138. The optical emitter 137 is configured to emit IR energy toward the optical receiver 138. Since the first wafer support 114 and the second wafer support 214 are located between the optical emitter 137 and the optical receiver 138, the IR energy passes through a first wafer 150 and a second wafer 152 of bonded wafers 156. Then, the optical receiver 138 receives the IR energy passing through the bonded wafers 156, and therefore at least one image of the first wafer 150 and the second wafer 152 of the bonded wafers 156 is received in the optical receiver 138. In some embodiments, the image of the first wafer 150 and the second wafer 152 of the bonded wafers 156 formed in the optical receiver 138 is transmitted to a display unit 134 for displaying. In some embodiments, the first camera 130 and the second camera 132 of the bonding module 206D are activated during a bonding process, and the optical emitter 137 and the optical receiver 138 of the bonding module 206D are activated after performing the bonding process. For example, a camera control unit 172, such as a computer, can be employed to control operations of the first and second cameras 130 and 132 prior to the operation of the optical emitter 137 and the optical receiver 138. In some embodiments, the optical emitter 137 is electrically coupled to the signal transmitter 162 through the camera control unit 172, and the signal transmitter 162 can send a signal to the optical emitter 137, so as to activate the optical emitter 137 to emit the IR energy toward the optical receiver 138.

As described above, the image of the bonded wafers is captured by the camera when the bonded wafers are coupled to the wafer support, so as to detect whether a bubble is between the bonded wafers. If the image shows no bubble is between the bonded wafers, the bonded wafers are moved to the subsequent process tool or chamber, thereby improving the yield rate of the bonded wafers in the subsequent processes. On the other hand, if the image shows a bubble between the bonded wafers, the clean process is performed on the bonding tool, so as to prevent next bonded wafers from forming bubble therebetween.

According to various embodiments of the present disclosure, a method is provided, and the method includes the following steps. A first wafer is coupled to a first support of a bonding tool and a second wafer is coupled to a second support of the bonding tool. The second wafer is bonded to the first wafer with the first wafer coupled to the first support. Whether a bubble is between the bonded first and second wafers in the bonding tool is detected.

In some embodiments, the detecting comprises performing an optical detection.

In some embodiments, the detecting is performed by FTIR, XRR, NRA, or combinations thereof.

In some embodiments, the method further comprises cleaning a chamber of the bonding tool accommodating the first and second supports when the bubble is detected between the bonded first and second wafers.

In some embodiments, loading of a third wafer is deferred until the cleaning completes.

In some embodiments, the detecting comprises capturing an image of the bonded first and second wafers by an infrared camera.

In some embodiments, the bonding comprises releasing the second wafer from the second support such that the second wafer is bonded to the first wafer, in which the detecting is performed after the releasing.

In some embodiments, the detecting is performed with the bonded first and second wafers coupled to the first support.

In some embodiments, the bonded first and second wafers is moved from the first support to a wafer carrier through a transportation space in the bonding tool, and the detecting is performed with the bonded first and second wafers in the transportation space.

In some embodiments, the detecting is performed using an optical detector, and the optical detector is not in contact with the bonded first and second wafers during the detecting.

According to various embodiments of the present disclosure, a method is provided, and the method includes the following steps. A first wafer is coupled to a first support and a second wafer is coupled to a second support. The second wafer is bonded to the first wafer with the first wafer coupled to the first support. An image of the bonded first and second wafers is captured. The bonded first and second wafers are moved to a wafer carrier after the capturing.

In some embodiments, the bonding comprises releasing the second wafer from the second support such that the second wafer is bonded to the first wafer, in which the capturing is performed after the releasing.

In some embodiments, a depth of field of the image comprises an interface between the bonded first and second wafers.

In some embodiments, the method further comprises cleaning the first support when at least one bubble is captured in the image.

In some embodiments, the method further comprises cleaning the second support when at least one bubble is captured in the image.

In some embodiments, the captured image is formed using infrared light.

According to various embodiments of the present disclosure, an apparatus is provided, and the bonding tool includes, a first wafer, a second wafer, an infrared camera, and a controller. The first wafer support is configured to hold a first wafer. The second wafer support is opposite to the first wafer support, in which the second wafer support is configured to hold a second wafer and release the second wafer onto the first wafer. The controller is configured to control the infrared camera to capture an image of the first and second wafers after the second wafer support releases the second wafer.

In some embodiments, the infrared camera is directed toward a space between the first wafer support and the second wafer support.

In some embodiments, the second wafer support has at least one hole and a vacuum pump in communication with the hole. The controller is configured to reduce a suction force from the vacuum pump to release the second wafer and to control the infrared camera to capture the image of the first and second wafers after the suction force from the vacuum pump is reduced.

In some embodiments, the apparatus further includes a chamber accommodating the first wafer support and the second wafer support, and the infrared camera is external to the chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    coupling a first wafer to a first support of a bonding tool and coupling a second wafer to a second support of the bonding tool;
    bonding the second wafer to the first wafer with the first wafer coupled to the first support;
    detecting whether a bubble is between the bonded first and second wafers in the bonding tool; and
    when a bubble is detected, transferring the bonded first and second wafers to a cleaning module of the bonding tool and performing a cleaning process on the bonded first and second wafers in the cleaning module, wherein detecting whether a bubble is between the bonded first and second wafers is in a same chamber of the bonding tool as bonding the second wafer to the first wafer.

2. The method of claim 1, wherein the detecting comprises performing an optical detection.

3. The method of claim 1, wherein the detecting is performed by Fourier transform infrared microscopy (FTIR), xray reflection (XRR), nuclear reaction analysis (NRA), or combinations thereof.

4. The method of claim 1, further comprising:
    cleaning a chamber of the bonding tool accommodating the first and second supports when the bubble is detected between the bonded first and second wafers.

5. The method of claim 4, wherein loading of a third wafer is deferred until the cleaning completes.

6. The method of claim 1, wherein the detecting comprises capturing an image of the bonded first and second wafers by an infrared camera.

7. The method of claim 1, wherein the bonding comprises:
    releasing the second wafer from the second support such that the second wafer is bonded to the first wafer, wherein the detecting is performed after the releasing.

8. The method of claim 1, wherein the detecting is performed with the bonded first and second wafers coupled to the first support.

9. The method of claim 1, wherein the bonded first and second wafers is moved from the first support to a wafer carrier through a transportation space in the bonding tool, and the detecting is performed with the bonded first and second wafers in the transportation space.

10. The method of claim 1, further comprising:
    activating a first camera before the bonding to align the second wafer to the first wafer; and
    activating a second camera different from the first camera after the bonding to perform the detecting.

11. A method comprising:
    coupling a first wafer to a first support of a first module and coupling a second wafer to a second support of the first module;
    bonding the second wafer to the first wafer with the first wafer coupled to the first support;
    capturing an image of the bonded first and second wafers after the bonded first and second wafers are moved from the first module to a transportation space and when the bonded first and second wafers are static at the transportation space; and moving the bonded first and second wafers from the transportation space to a second module after the capturing.

12. The method of claim 11, wherein the bonding comprises:
releasing the second wafer from the second support such that the second wafer is bonded to the first wafer, wherein the capturing is performed after the releasing.

13. The method of claim 11, wherein a depth of field of the image comprises an interface between the bonded first and second wafers.

14. The method of claim 11, further comprising cleaning at least one of the first support and the second support when at least one bubble is captured in the image.

15. The method of claim 11, further comprising:
detecting whether a bubble is between the bonded first and second wafers in the first module; and
when a bubble is detected, cleaning the bonded first and second wafers, wherein detecting whether a bubble is between the bonded first and second wafers is in a different chamber of the first module as cleaning the bonded first and second wafers.

16. The method of claim 11, further comprising:
detecting whether a bubble is between bonded first and second wafers in a bonding tool; and
when a bubble is detected, cleaning the bonded first and second wafers, wherein detecting whether a bubble is between the bonded first and second wafers is in a different chamber of the bonding tool as cleaning the bonded first and second wafers.

17. An apparatus comprising:
a first wafer support configured to hold a first wafer;
a second wafer support opposite to the first wafer support, wherein the second wafer support is configured to hold a second wafer and to release the second wafer onto the first wafer and is formed with an aperture that extends from a bottom surface to a top surface of the second wafer support, and the second wafer support is at least partially transparent to infrared radiation;
a pin disposed in the aperture, extending through the bottom and top surfaces of the second wafer support, and configured to bond the second wafer to the first wafer;
an infrared camera above the second wafer support; and
a controller configured to control the infrared camera to capture an image of the bonded first and second wafers when the second wafer support releases the second wafer.

18. The apparatus of claim 17, further comprising a chamber, wherein the first wafer support, the second wafer support, and the infrared camera are disposed in the chamber.

19. The apparatus of claim 17, further comprising a first camera and a second camera, wherein the infrared camera is between the first camera and the second camera.

20. The apparatus of claim 17, further comprising:
a chamber;
a transfer module external to the chamber, in a transportation space, and configured to move the first wafer and the second wafer into the chamber and move the bonded first and second wafers out of the chamber; and
a second infrared camera disposed external to the chamber and in the transportation space, wherein the second infrared camera is configured to capture an image of the bonded first and second wafers after the bonded first and second wafers is moved out of the chamber.

* * * * *